United States Patent
Kawanishi (10) Patent No.: US 8,134,284 B2
(45) Date of Patent: Mar. 13, 2012

(54) TUNING-FORK TYPE PIEZOELECTRIC VIBRATING PIECES HAVING SIMILARLY SHAPED VIBRATING-ROOT AND SUPPORTING ROOT PORTIONS

(75) Inventor: Shingo Kawanishi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 303 days.

(21) Appl. No.: 12/470,445

(22) Filed: May 21, 2009

(65) Prior Publication Data

US 2009/0289530 A1    Nov. 26, 2009

(30) Foreign Application Priority Data

May 22, 2008    (JP) ................. 2008-134158

(51) Int. Cl.
*H03H 9/19*    (2006.01)
(52) U.S. Cl. .................................................. 310/370
(58) Field of Classification Search .......... 310/370
See application file for complete search history.

(56) References Cited

U.S. PATENT DOCUMENTS

| | | | | |
|---|---|---|---|---|
| 5,824,900 A | * | 10/1998 | Konno et al. | 73/504.16 |
| 5,987,987 A | * | 11/1999 | Watarai | 73/504.16 |
| 7,205,708 B2 | * | 4/2007 | Yamada | 310/370 |
| 7,714,484 B2 | * | 5/2010 | Hara et al. | 310/348 |
| 7,863,804 B2 | * | 1/2011 | Tanaya | 310/370 |
| 7,906,890 B2 | * | 3/2011 | Kawanishi et al. | 310/370 |
| 2009/0102327 A1 | * | 4/2009 | Kawashima | 310/370 |

FOREIGN PATENT DOCUMENTS

| | | | |
|---|---|---|---|
| JP | 58-064128 | | 4/1983 |
| JP | 2006094154 A | * | 4/2006 |
| JP | 2006-148857 | | 6/2006 |
| JP | 2008-022413 | | 1/2008 |
| JP | 2009-182932 | | 8/2009 |

* cited by examiner

*Primary Examiner* — Jaydi San Martin
(74) *Attorney, Agent, or Firm* — Klarquist Sparkman, LLP (57) ABSTRACT

Piezoelectric vibrating pieces are disclosed. An exemplary piece includes a base and at least a pair of vibrating arms connected to the base. The vibrating arms extend from one end of the base in a first direction. A vibrating root portion is situated between the vibrating arms. A pair of supporting arms extend, outboard of the vibrating arms, in the first direction from the one end of the base. Respective supporting root portions are situated between each vibrating arm and its outboard supporting arm, at the same position (denoted, e.g., K1, K2) in the first direction of the vibrating root portion.

7 Claims, 6 Drawing Sheets

(PRIOR ART)

TUNING-FORK TYPE PIEZOELECTRIC VIBRATING PIECES HAVING SIMILARLY SHAPED VIBRATING-ROOT AND SUPPORTING ROOT PORTIONS

CROSS-REFERENCE TO RELATED APPLICATION

This application claims priority to and the benefit of Japan Patent Application No. 2008-134158, filed on May 22, 2008, in the Japan Patent Office, the disclosure of which is incorporated herein by reference in its entirety.

FIELD

This disclosure pertains to techniques for manufacturing a tuning-fork type piezoelectric vibrating elemental device having supporting arms and particular configurations of vibrating arms. The devices are manufactured from a piezoelectric substrate comprising, for example, crystal such as quartz crystal.

DESCRIPTION OF THE RELATED ART

Various types of clocks, home electric appliances, and consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating device, or an IC chip as a clock source for addition to and use by an electronic circuit of the apparatus. In other apparatus, piezoelectric timing devices such as real-time clock modules are widely used. Other uses for piezoelectric vibrating devices include apparatus for navigation-control or attitude-control of ships, aircraft, and automobiles; and angular-velocity sensors in image-stabilizers and other detectors used in video cameras and the like. Also, piezoelectric vibrating gyros are widely used in various devices including rotation-direction sensors used in, e.g., three-dimensional mouse devices.

Especially nowadays, piezoelectric vibrating devices must be increasingly miniaturized and/or provided with a thinner or lower profile so as to be correspondingly accommodated in electronic devices that likewise are miniaturized and/or provided with a lower profile. Also, modern piezoelectric devices desirably exhibit a suitably low CI (crystal impedance) value, high quality, and stability. One type of tuning-fork type piezoelectric vibrating device having vibrating arms has been developed that exhibits low CI. For such a device a tuning-fork type piezoelectric vibrating piece having a shorter body and supporting arms, has been developed.

Figure 6:
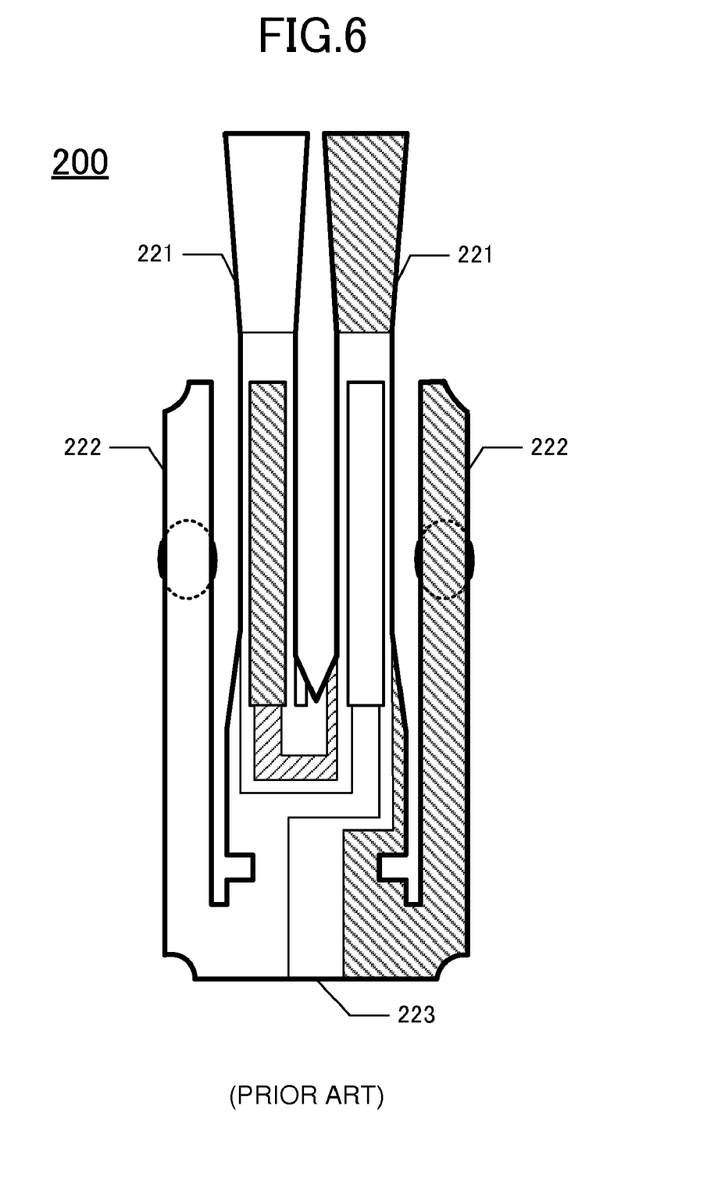
FIG. 6 is a plan view of a tuning-fork type crystal vibrating piece 200 having conventional supporting arms.

As shown in FIG. 6, Japan Unexamined Patent Publication No. 2006-148857 is directed to a tuning-fork type crystal vibrating piece 200 having a base 223. From the base 223 a pair of vibrating arms 221 and a pair of supporting arms 222 extend, first in the width direction (X-direction in the figure) of the base 223 and then in the length direction (Y-direction in the figure) of the vibrating arms. The supporting arms 222, situated outboard of the vibrating arms, minimize adverse effects inside the package from temperature changes outside the package and reduce the physical shocks on the vibrating arms of impacting the crystal vibrating piece. This configuration also improves the temperature characteristics of the piece. The supporting arms 222 also reduce vibration leakage from the vibrating arms 221 in the package to the outside of the package. Thus, the piece exhibits improved CI.

At the base between the vibrating arms 221 is a V-shaped "vibrating root portion." Between each vibrating arm 221 and its respective supporting arm 222 is a complex-shaped "supporting root portion." In the Y-direction, the coordinate for the vibrating root zone is not the same as the coordinate for the supporting root zone. Applicants have discovered that, with this configuration of a piezoelectric vibrating piece, attempts to reduce the Y-direction length of the base 223 for miniaturization purposes tends not to attenuate vibration leakage sufficiently and tends to exhibit increased CI. Also, during the etching step in which the profile outline of the tuning-fork type piezoelectric vibrating piece is formed, anomalous etch zones are usually formed due to the effect of crystal anisotropy on local etching rates, especially in the root portions. Anomalous etch zones have substantial impact on the characteristics of the tuning-fork type piezoelectric vibrating piece, especially with increased miniaturization.

Anomalous etch zones also deform the tuning-fork type piezoelectric vibrating piece. Even small variations in the dimensions of the vibrating arms and/or root portions caused by anomalous etching produce significant vibration leakage. Especially with increased miniaturization, etchant may not flow sufficiently around the root portions to produce desired etching rates in those locations. Also, etching may be more difficult to perform with more miniaturized configurations of piezoelectric vibrating pieces due to anisotropy of the crystal.

One purpose of the present invention is to provide tuning-fork type piezoelectric vibrating pieces having shorter bases and shorter supporting arms in accordance with desired miniaturization the vibrating pieces. During manufacture, the tuning-fork type piezoelectric vibrating pieces remain bisymmetric during etching, and the vibrating pieces have well-defined profile outlines.

SUMMARY

The invention has several aspects, of which a first aspect pertains to piezoelectric vibrating pieces. A piezoelectric vibrating "piece" is a component that is made of a piezoelectric material, that is configured to vibrate at a preset frequency when electrically energized, and that is normally encased in an appropriate package to form a piezoelectric vibrating "device." An embodiment of a piezoelectric vibrating piece comprises a base having a first end and an opposing second end. A pair of vibrating arms extending from the first end of the base in a first direction. A "vibrating root portion" is situated on the base between the vibrating arms. A pair of supporting arms extend, outboard of the vibrating arms, from the first end of the base in the first direction. A respective "supporting root portion" is situated on the base between each vibrating arm and respective supporting arm. The supporting root portions are located at substantially the same coordinate along the first direction as the vibrating root portion. With such an embodiment the CI exhibited by the piezoelectric vibrating piece, as well as the vibration leakage, are reduced. Also, during fabrication, the root portions can be made accurately symmetrical to each other, providing uniform etching to form a bisymmetric configuration of the piezoelectric vibrating piece.

In certain embodiments the distance from the second end of the base along the first direction to the supporting root portions is equal to the distance from the second end of the base along the first direction to the vibrating root portion. Again, this configuration provides even, bisymmetric etching during fabrication of the piezoelectric vibrating piece.

Another embodiment of a piezoelectric vibrating device comprises a base having a first end and an opposing second end. A pair of vibrating arms extends from the first end of the base in a first direction. A vibrating root portion is situated on the base between the vibrating arms. Outboard of each vibrating arm and extending in the first direction from the first end of the base is a respective supporting arm. The width (perpendicular to the first direction) between the vibrating arms is equal to the width between each vibrating arm and its respective supporting arm. In this configuration, the vibrating root portion as well as supporting root portions situated on the base between each vibrating arm and respective supporting arm facilitate bisymmetric etching. The bisymmetry provides for a balanced configuration of the piezoelectric vibrating piece, which improves the CI value and reduces vibration leakage. In a variation of this embodiment, the respective coordinates of the vibrating root portion and supporting root portions along the first direction are the same. In another variation the supporting root portions and vibrating root portions have the same shape. The shape, or profile, can be one having angular sides or curved sides. In either case all the root portions are reliably formed by etching to have the same shape.

In another embodiment of a piezoelectric vibrating piece each vibrating arm progressively narrows with increasing length in the first direction to a first constriction, then extends from the first constriction in the first direction with a first width to a second constriction, and then extends from the second constriction in the first direction to its distal end with a second width greater than the first width. With such configurations of vibrating arms, stable vibration frequency is obtained because especially harmonic CI value and Q value can be controlled.

In yet another embodiment of a piezoelectric vibrating piece each vibrating arm progressively narrows with increasing length in the first direction from its respective root portions to a constriction, and then gradually widens with further increasing length in the first direction from the constriction to its distal end. This configuration of vibrating arms also provides stable vibration frequency and controlled harmonic CI and Q values.

In some embodiments each vibrating arm can include at least one groove in which a respective excitation electrode is formed to excite the vibrating arms. Thus, the vibrating arms can be oscillated easily and CI readily lowered.

In yet another embodiment each supporting root portion and vibrating root portion have substantially identical shapes.

In yet another embodiment each vibrating arm progressively narrows with increasing length in the first direction to a first constriction, then extends from the first constriction in the first direction with a first width to a second constriction. Each vibrating arm can extend from the second constriction in the first direction to its distal end with a second width greater than the first width.

Any of the piezoelectric vibrating pieces disclosed herein produce stable vibration frequency even after further miniaturization. Even after miniaturization, the piezoelectric vibrating piece exhibits resistance to degradation of the CI value.

According to another aspect, piezoelectric vibrating devices are provided that include a piezoelectric vibrating piece as summarized above, a package base, and a lid. The package base receives the piezoelectric vibrating piece mounted therein, and the lid is used to cover and seal the package. The piezoelectric vibrating piece is mounted in the package via the supporting arms that are affixed to the package base.

DETAILED DESCRIPTION

An exemplary tuning-fork type crystal vibrating piece of this invention is configured to oscillate at a frequency of 32.768 kHz. The length of this piece in the Y-direction is about 1.45 mm, width in the X-direction is about 0.5 mm, and height in the Z-direction is about 0.12 mm. Dimensional variations can arise during the etching step used for forming the profile outline of the tuning-fork type crystal vibrating piece. These small dimensional variations from specifications can have substantial impact (e.g., undesired increases in CI) in view of the small size of the miniaturized tuning-fork type crystal vibrating piece. The following embodiments provide tuning-fork type crystal vibrating pieces that can be miniaturized while exhibiting desired CI values, despite having dimensional variations.

First Embodiment

Figure 1A:
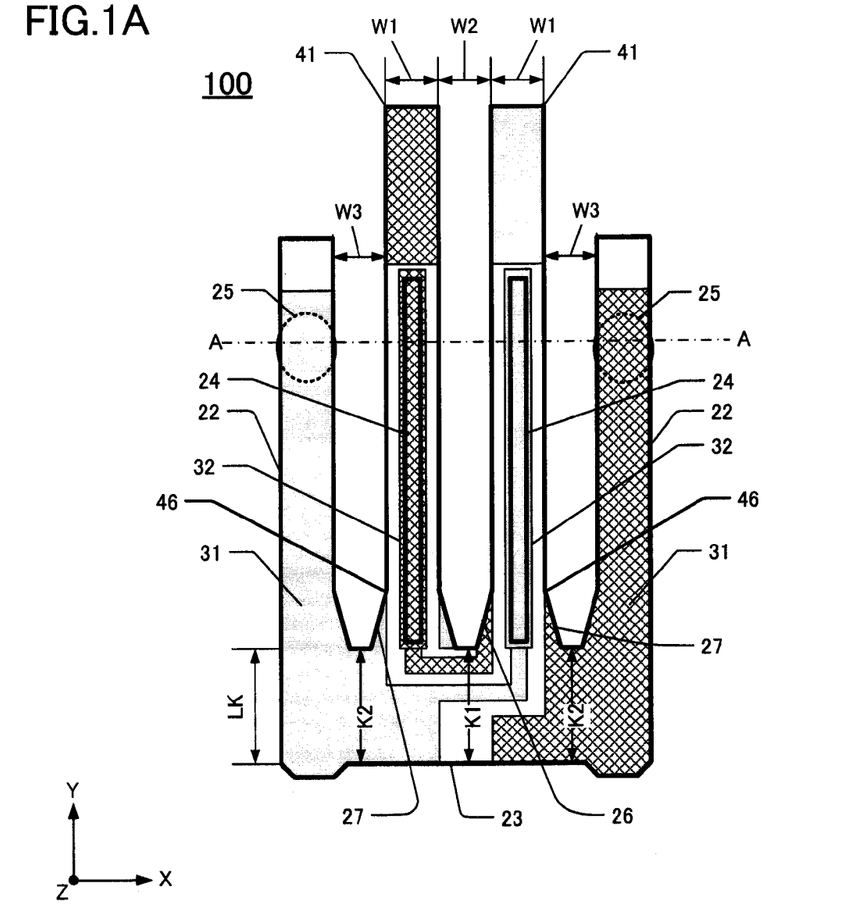
FIG. 1A is a plan view of a first embodiment of a tuning-fork type crystal vibrating piece.
Figure 1B:
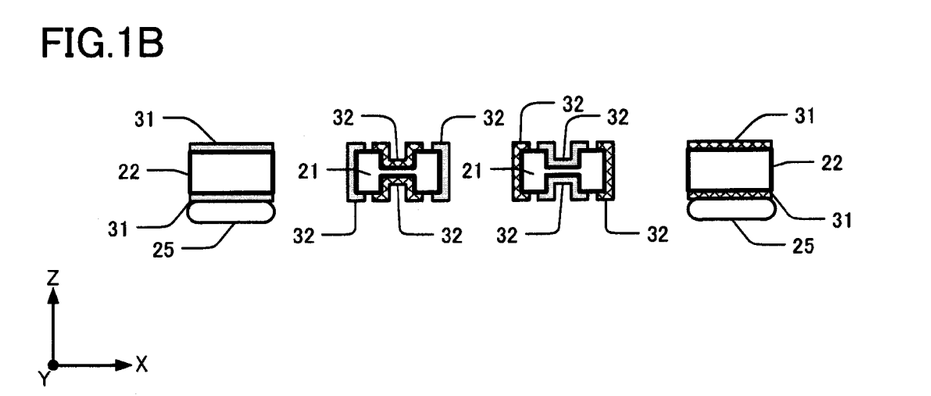
FIG. 1B is a cross-sectional view along the line A-A in FIG. 1A.

This embodiment of a tuning-fork type crystal vibrating piece 100 is shown in FIG. 1A. The crystal vibrating piece 100 comprises a pair of vibrating arms 41 and a pair of supporting arms 22. FIG. 1B is a cross-sectional view along the line A-A in FIG. 1A. The vibrating arms 41 extend from a base 23. The length LK of the base 23 (in the Y-direction) is about 0.20 mm, and the length (in the Y-direction) of each vibrating arm 41 is about 1.25 mm.

The vibrating arms 41 extend parallel to each other from the base 23. A respective groove 24 is formed on each of the upper and lower surfaces of each vibrating arm 41, yielding a total of four grooves 24 per pair of vibrating arms 41. As shown in FIG. 1B, a cross-section of a vibrating arm 41 having grooves 24 on the upper and lower surfaces has a substantially H-shaped transverse profile. The H-shaped profile is effective in reducing the CI of the crystal vibrating piece 100.

Each vibrating arm 41 has "root" portions 26, 27 at which the arm is connected to the base 23. The root portions 26, 27 of an arm are wider (in the X-direction) than the arm itself. The root portions 26, 27 concentrate stress, generated by vibration of the respective arms 41, and transfer the stress to a constriction 46 to reduce vibration leakage to the base 23.

Although the embodiment of FIG. 1A has a total of four grooves 24 formed on the pair of vibrating arms 41, it will be understood that more than one groove can be formed on each side of each vibrating arm. In certain embodiments, the benefits of grooves 24 can be obtained even if grooves are not formed on the vibrating arms. Other embodiments, such as the second and third embodiments described later below, have grooves 24 similar to those in the embodiment of FIG. 1A.

The base 23 of the crystal vibrating piece 100 has a substantially "board" shape. The length LK of the base 23 (Y-direction) is preferably as short as possible to minimize the overall length (Y-direction) of the crystal vibrating piece 100. However, only reducing the length LK of the base may cause vibrations of the arms 41 to be readily conducted to the exterior of the package as vibration leakage. Only reducing the length LK may also cause vibrations of the arms 41 to be adversely affected easily by temperature changes or by physical impacts outside the package. Therefore, in this embodiment, the supporting arms 22 on the tuning-fork type crystal vibrating piece 100 are specifically configured to reduce vibration leakages and thereby reduce sensitivity of the vibrating arms 41 to external changes.

The supporting arms 22 are mounted via connecting portions 25 to a package enclosing the crystal vibrating piece 100. The connecting portions 25 are attached to the supporting arms at respective locations that are distal from the base 23 so as to reduce vibration leakages from the vibrating arms 41 and reduce internal effects of external changes. Making the profile outline of the crystal vibrating piece 100 with the configuration described below reduces unwanted configurational anomalies caused by etching and allows tuning-fork type crystal vibrating pieces 100 to be produced having symmetry and balance.

As FIG. 1A shows, the base 23 extends the length LK in the Y-direction. The supporting arms 22 extend in the Y-direction from respective locations on the body 23 that are extended slightly in the X-direction. The width between the vibrating arms 41 is denoted W2. Note that W2 is substantially equal to the width W1 of each vibrating arm 41. Note also that W1 is substantially equal to the width W3 between each vibrating arm 41 and its respective supporting arm 22. Thus, the "first" width W1, the "second" width W2, and the "third" width W3 of the crystal vibrating piece 100 are all substantially equal to each other in this embodiment. As a result of W1=W2=W3, the flow of etchant around the arms 41, 22 during fabrication is substantially uniform, which forms a precisely bisymmetric crystal vibrating piece 100.

A "vibrating root" portion 26 connects inboard proximal portions of the vibrating arms 41 to the base 23. Hence, the vibrating root portions 26 are situated between the vibrating arms 41. The region between the vibrating root portions 26 is U-shaped with angular sides and bottom. Similarly, respective "supporting root" portions 27 connect outboard proximal portions of the vibrating arms 41 and inboard proximal portions of the supporting arms 22 to the base 23. The region between the supporting root portions 27 is U-shaped with angular sides and bottom. The base 23 has a length LK in the Y-direction sufficient for providing the length K1 from the bottom of the vibrating root portion 26 and lengths K2 from the bottom of each supporting root portion 27. All three root zones have the same coordinate in the Y-direction (but different coordinates in the X-direction). Hence, K1=K2.

Despite differences in etch rates of the crystal material caused by crystal anisotropy, the desired shape of the crystal vibrating piece 10 can be achieved by forming the above-described shapes of the vibrating root portions 26 and supporting root portions 27, and also by making K1=K2. That is, the crystal vibrating piece 100 can be made bisymmetric as desired by making the widths W1=W2=W3, K1=K2, and each root portion substantially the same shape.

The supporting arms 22 desirably are shorter in length (Y-direction) than the vibrating arms 41. After forming the profile outline of the crystal vibrating piece 100, electrodes are formed on the upper and lower surfaces of the vibrating arms, and metal layers are formed on the distal upper surfaces of the vibrating arms 41, all at the same time. The metal coatings are formed on the distal upper surfaces of the vibrating arms 41 for use as weights that can be trimmed subsequently to achieve a desired frequency tuning control of the tuning-fork type crystal vibrating piece 100 when used as a piezoelectric device. The general outline profiles and grooves 24 of the crystal vibrating piece 100 are formed using known photolithography and etching techniques. Specific details of forming the outline profile and grooves 24 are discussed below.

The profile outlines of multiple tuning-fork type crystal vibrating pieces 100 are typically formed simultaneously on a circular or rectangular shaped crystal wafer. First, the profile outlines are defined by forming on the surface of the wafer a patterned mask made of a corrosion-resistant film. The mask defines openings that are vulnerable to etching. Etching is conducted using, for example, fluorinated acid solution which etches the crystal exposed in the openings of the mask. The corrosion-resistant film of the mask is a metal film deposited on a chrome sub-film. Etching desirably is by wet-etching. Etching conditions can be varied depending on density of the wafer, concentration of fluorinated acid, and etching temperature.

Due to differences in exposed crystal-lattice surfaces, etching is anisotropic. The X-axis of the crystal axis shown in FIG. 1A is the width dimension of the crystal vibrating piece 100, the Y-axis is the length dimension, and the Z-axis is the thickness dimension. Anisotropy occurs in the X-, Y-, and Z-axes. Regarding the etching rates of the crystal vibrating piece 100, the Z-axis experiences the greatest rate. The rate is respectively lower in the +X-axis, then in the −X-axis, and is lowest in the Y-axis.

Due to such anisotropic etching, the tuning-fork type crystal vibrating piece 100 can become deformed during etching (not shown), wherein the deformation (usually an inadequately etched region) projects as a fin-like structure from the outer edge of one or both each vibrating arms and/or supporting arms.

Formation of Grooves

After forming the outline profiles of the crystal vibrating pieces 100, grooves 24 are formed using a resist that is microlithographically patterned for forming the grooves on the vibrating arms 41. The resist is applied to form respective walls that sandwich each desired groove region. The corrosion-resistant film of the mask is left in areas where the grooves 24 are not formed. Then, wet-etching is performed on both the upper and lower surfaces of the vibrating arms 41, with etching conditions being substantially the same as during wet-etching performed to form the outline profiles. The depth of the grooves 24 is normally 30 to 45 percent of the thickness of the vibrating arms.

Note that either or both the wet-etching steps discussed above (for forming profile outlines and for forming grooves) can alternatively be performed by dry-etching instead of wet-etching. For dry-etching, metal masks are formed on the crystal wafer to define the profile outline of the crystal vibrating piece 100. Then, another respective metal mask is formed on the crystal wafer surface to define the grooves. In such a condition, the crystal wafer is placed into a chamber (not shown), and etching gas is delivered to the chamber that has been evacuated to a pre-designated degree of vacuum to form an etching plasma. The etching plasma is a dry-etchant.

For example, a source of Freon (®Dupont) gas and a source of oxygen gas can be connected to a chamber that is also connected to a vacuum source by an evacuation conduit. Via the conduit, the vacuum source establishes a predetermined vacuum state in the chamber. Meanwhile, Freon gas and oxygen gas are delivered to the chamber to establish desired concentrations of these gases in the subatmospheric environment in the chamber. At the desired concentrations of gases and vacuum level, a direct-current voltage is discharged in the chamber to produce a plasma. The plasma ionizes the molecules of the gases, and the ions bombard the regions of the piezoelectric vibrating piece not covered by the metal mask. This bombardment ablates the piezoelectric material, resulting in dry-etching.

Forming Electrodes

In FIG. 1A, electrodes comprise base electrodes 31 and excitation electrodes 32. The excitation electrodes 32 are formed on the upper and lower surfaces of the vibrating arms 41, as shown in FIG. 1B. The base electrodes 31 and the excitation electrodes 32 each have a two-layer structure in which a layer of Au is formed on a sub-layer of Ni, for example.

To form an electrode, metal layers intended to constitute the electrode are formed on the entire surfaces of the arms by vacuum deposition or sputtering. The electrodes are patterned by photolithography using a resist to define denuded areas where electrodes are not to be formed. Then, electrodes (as well as the weights on the distal ends of the vibrating arms) are formed on the front and rear surfaces of the vibrating arms 24 by sputtering or vacuum deposition. The weights are used for fine adjustment of the vibration frequency of the vibrating arms 41.

The following embodiment omits an illustration and discussion of electrodes because the electrodes are formed in the same way as described above.

Fabrication of Piezoelectric Device

Figure 2A:
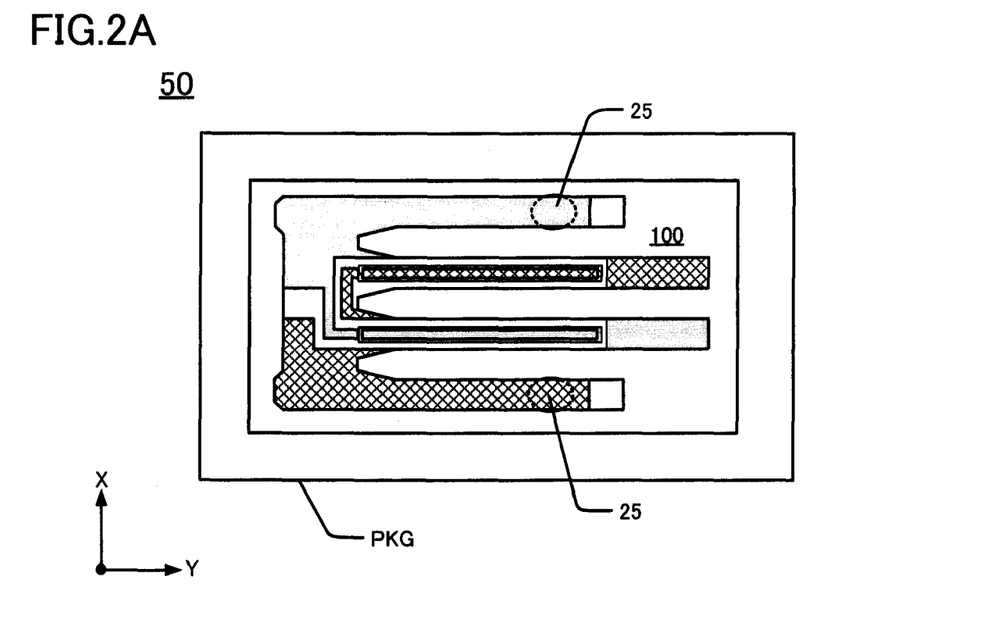
FIG. 2A is a plan view of a piezoelectric device 50.
Figure 2B:
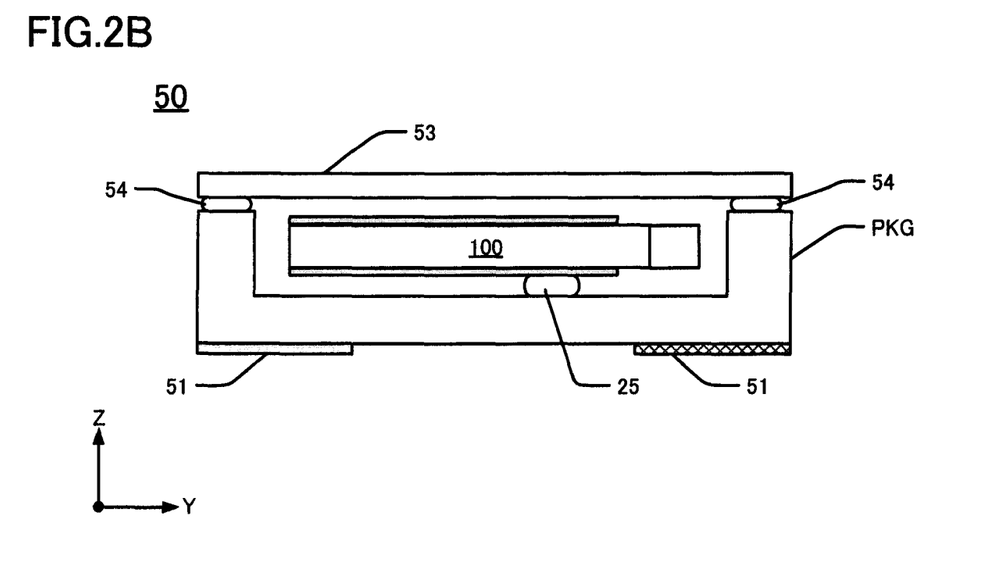
FIG. 2B is a schematic cross-sectional view of the piezoelectric device 50 shown in FIG. 2A.

FIG. 2A shows a schematic top view of the piezoelectric device 50, and FIG. 2B is a cross-sectional view of FIG. 2A. The piezoelectric device 50 is formed as follows. A tuning-fork type crystal vibrating piece 100, formed as described above, is placed into a package PKG that defines a cavity. The crystal vibrating piece 100 is mounted to the package PKG using the connecting portions 25 of the supporting arms 22. The package PKG is then placed in a vacuum chamber in which a lid 53 is placed on the package PKG over the cavity (containing the crystal vibrating piece 100) and sealed to the package PKG using a sealing material 54. By forming the lid 53 of borosilicate glass, for example, or other suitable translucent material, the vibration frequency of the piezoelectric device 50 can be fine-tuned after sealing the package, using a trimming laser illuminated through the lid.

The package PKG is made of ceramic, formed by laminating a plurality of ceramic sheets together to form an open-box shape. The package PKG can be configured as a SMD (surface mount device) by placing external electrodes 51 on the under-surface of the package PKG.

The tuning-fork type crystal vibrating piece 100 is mounted in the package via the connecting portions 25 of the supporting arms 22. For example, the connecting portions 25 can be mounted on respective units of electrically conductive adhesive applied to respective electrodes (not shown) in the package PKG. After mounting the crystal vibrating piece, the electrically conductive adhesive is thermally cured in a curing furnace. The resulting full cure connects the connecting portion 25 in a conductive manner to the tuning-fork crystal vibrating piece 100 and to the package PKG. This connecting includes electrical connections to the external electrode 51 located outside the package.

Frequency adjustment of the piezoelectric device 50 is performed by a mass-reduction method. A laser light is irradiated onto the distal surfaces of the vibrating arms 41 on which "weight" metal layers have been formed. The laser light evaporates or sublimates a part of the metal weight material. The manufacture of the piezoelectric device 50 is complete upon performing a test of operational performance of the device.

A piezoelectric device 50 fabricated as described above exhibits less degradation of CI than conventional devices. This greater stability of CI is achieved by, inter alia, modifying the shape of the vibrating arms 41 of the tuning-fork type crystal vibrating piece 100, as described above (compare FIG. 1A with FIG. 6). The second and third embodiments described below have alternative configurations of vibrating arms that also exhibit less CI degradation.

Second Embodiment

Figure 3:
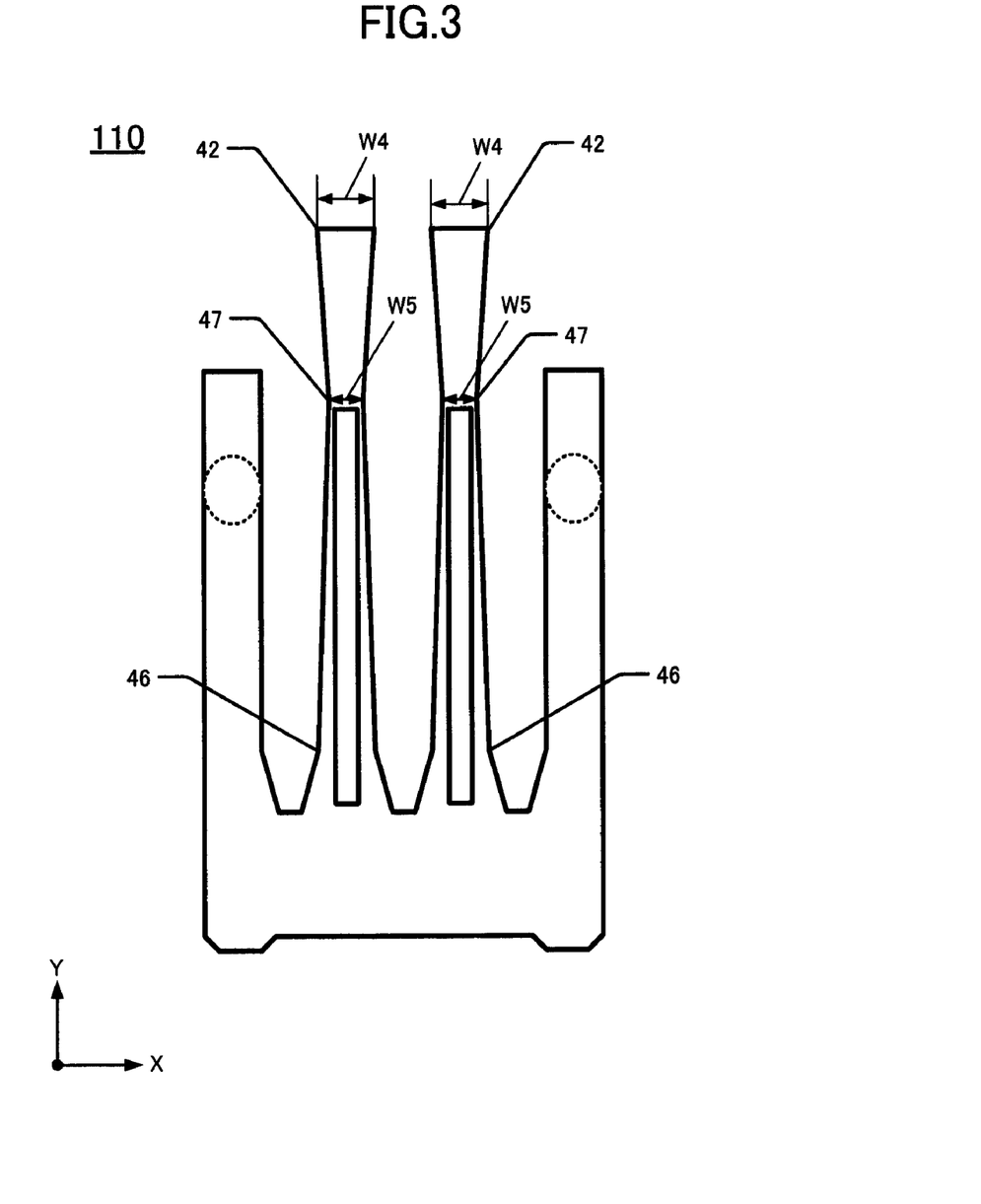
FIG. 3 is a plan view of a second embodiment of a tuning-fork type crystal vibrating piece 110.

FIG. 3 shows a second embodiment of the tuning-fork type crystal vibrating piece 110, comprising a pair of vibrating arms 42. Except for the configuration of the vibrating arms 42 of this embodiment 110, other components thereof are similar to corresponding components in the first embodiment and are not described further. Also, the electrodes are not shown in FIG. 3 (or described below) to facilitate clarity.

In FIG. 3 the vibrating arms 42 extend from the base 23 and gradually become narrower with increasing distance in the Y-direction from their respective root portions. A first constriction 46 is located just distally of the root portions. The vibrating arms 42 gradually narrow with increased distance from the first constriction 46 to a second constriction 47 located near the distal ends of the vibrating arms 42. From the second constriction 47, the vibrating arms 42 gradually widen with increasing distance to the distal ends of the arms. Despite these gradations in width, the vibrating arms 42 do not touch each other.

Compared to the first embodiment 100, in the second embodiment 110 the vibrating arms 42 are narrower and have first and second constrictions 46 and 47. With such arm configurations, stresses that otherwise would concentrate around the root portions are shifted to the edges of the vibrating arms 42, which reduces vibration leakage to the base. Note that the width W4 of the vibrating arms 42 is reduced gradually in both length directions (Y and −Y) the minimum width W5 of the second constriction. This configuration stabilizes the CI value, prevents generation of higher overtone modes, and produces stable fundamental-frequency vibrations of the vibrating arms.

The tuning-fork type crystal vibrating piece 110 of this embodiment can be packaged in a manner similar to that discussed above. If the package lid is made of a transparent material (e.g., glass), the vibration frequency can be finely tuned using a laser, as described above.

Third Embodiment

Figure 4:
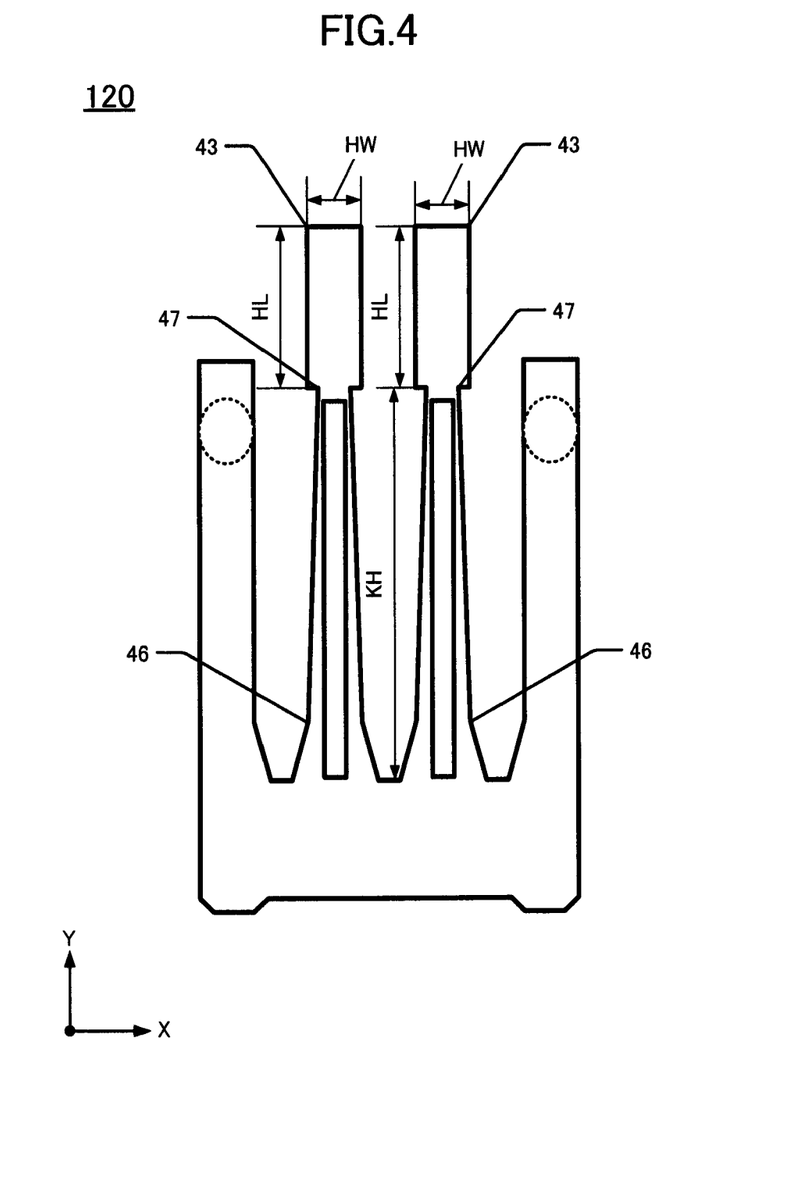
FIG. 4 is a plan view of a third embodiment of a tuning-fork type crystal vibrating piece 120.

This embodiment is shown in FIG. 4, and includes a tuning-fork type crystal vibrating piece 120 comprising a pair of vibrating arms 43 exhibiting increased CI stability. Except for the description of the vibrating arms 43, descriptions of other components and features of the crystal vibrating piece 120 are not provided because the other components and features are as described above in the first embodiment. Also, the electrodes are not described or shown to facilitate clarity of features actually shown.

As can be seen in FIG. 4, the vibrating arms 43 extend lengthwise from the base 23 and narrow in their root regions to a first constriction 46 situated as in the second embodiment. From the first constriction 46, the vibrating arms 43 progressively narrow to a second constriction 47. But, at the second constriction 47, the vibrating arms 43 become suddenly wider (to HW), and the width HW remains constant from the second constriction 47 to the distal tips of the arms. Thus, the arms 43 have a somewhat hammer-head shape. Nevertheless, the arms 43 do not touch each other.

In this embodiment, since the vibrating arms 43 are narrow with two different widths represented by the first and second constrictions 46, 47, stress that otherwise would be concentrated around the root portions is shifted to the edges of the vibrating arms 43, which reduces vibration leakage to the base 23. Also, by this means, the CI is stabilized and minimized, and production of higher overtone modes during vibration of the arms 43 is prevented. A stable fundamental mode is produced by adjusting the "hammer" width HW, the "hammer" length HL, and the length KH of the vibrating arms from the hammer to the base.

The tuning-fork type crystal vibrating piece 120 can be mounted in a package to produce a piezoelectric 50 device in a manner as described in the first embodiment. The vibration frequency can be adjusted after packaging, as previously described.

Figure 5A:
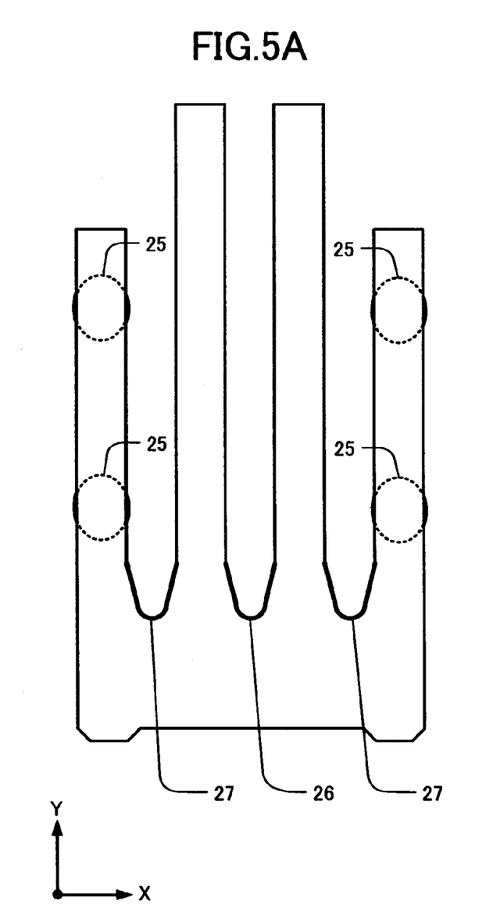
FIG. 5A is a plan view of an alternative configuration of the first embodiment of a tuning-fork type crystal vibrating piece 100.
Figure 5B:
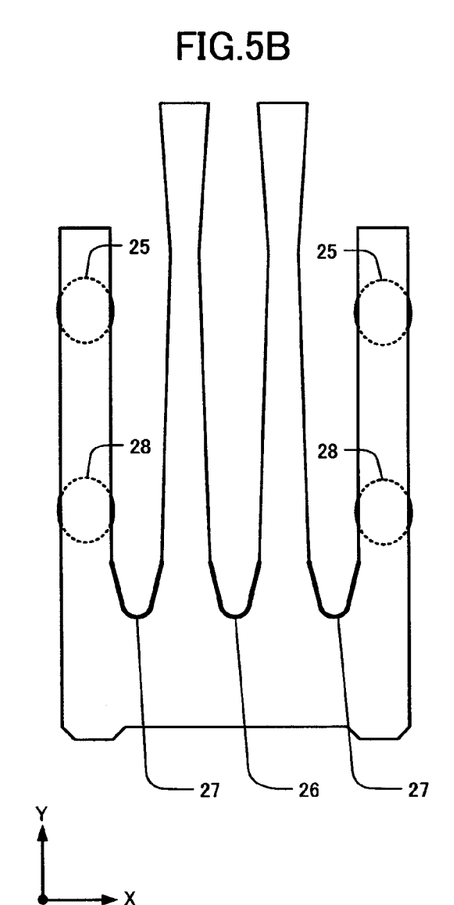
FIG. 5B is a plan view of an alternative configuration of the second embodiment of a tuning-fork type crystal vibrating piece 110.
Figure 5C:
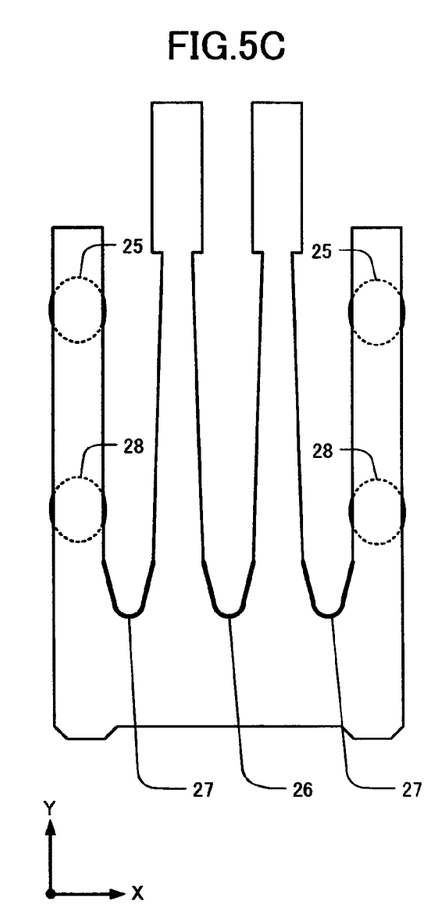
FIG. 5C is a plan view of an alternative configuration of the third embodiment of a tuning-fork type crystal vibrating piece 120.

The vibrating root portions 26 and supporting root portions 27 of the first, second, and third embodiments have angular shapes and flat bottoms. Alternatively they can have rounded, U-shaped bottoms as shown in FIGS. 5A, 5B, and 5C, respectively. Also, in each embodiment the piezoelectric vibrating piece is mounted in the package PKG using one connecting portion 25 per supporting arm. Alternatively, two connecting portions 25, 28 can be used per supporting arm, as shown in FIGS. 5A, 5B, and 5C, to increase the strength of each supporting arm 22. Use of two connecting portions 25, 28 per supporting arm 22 can be more effective than use of one connecting portion, especially in preventing leakage of vibrations from the vibrating arms to the package PKG. Use of two connecting portions also further inhibits propagation of stresses and physical shocks from outside to inside the package caused by external temperature changes, for example. In FIGS. 5A-5C, the electrodes and grooves 24 are not shown for clarity.

Representative embodiments are described above. It will be understood by those skilled in the art that these embodiments can be modified or changed while not departing from the spirit and scope of them and/or of the appended claims. For example, for the piezoelectric vibrating piece, lithium niobate, or other piezoelectric single-crystal material can be used instead of quartz crystal.

What is claimed is:

1. A piezoelectric vibrating piece, comprising:
    a base having a first end and an opposing second end;
    a pair of vibrating arms extending from the first end of the base in a first direction, each vibrating arm progressively narrowing from the first end to a respective constriction located distally in the first direction;
    a vibrating root portion situated between the vibrating arms;
    a pair of supporting arms extending, outboard of the vibrating arms, from the first end of the base in the first direction, each supporting arm progressively narrowing from the first end to a respective constriction located distally in the first direction; and
    a respective supporting root portion situated between each vibrating arm and respective supporting arm;
    wherein the vibrating root portion defines a void extending in the first direction between the vibrating arms from the first end of the base, where the vibrating root portion is wider, to the constrictions where the vibrating root portion is narrower;
    each supporting root portion defines a void extending in the first direction between the respective vibrating arm and respective supporting arm from the first end of the base, where the supporting root portion is wider, to the constriction where the supporting root portion is narrower; and
    the vibrating root portion and supporting root portions have substantially identical shapes.

2. The piezoelectric vibrating piece of claim 1, wherein each vibrating arm:
    has a distal end; and
    extends in the first direction, at substantially constant width or at a width greater than the width of the constriction, from the constriction in the first direction to its distal end.

3. The piezoelectric vibrating piece of claim 1, wherein each vibrating arm includes at least one groove in which a respective excitation electrode is formed to excite the vibrating arms.

4. The piezoelectric vibrating piece of claim 1, wherein a distance from the second end of the base to the supporting root portions is substantially equal to the distance from the second end of the base to the vibrating root portion.

5. The piezoelectric vibrating piece of claim 4, wherein each vibrating arm includes at least one groove in which a respective excitation electrode is formed to excite the vibrating arms.

6. A piezoelectric vibrating device, comprising:
    a piezoelectric vibrating piece as recited in claim 4;
    a package base to which the piezoelectric vibrating piece is mounted by connecting the supporting arms to the package base via at least one connecting portion per supporting arm; and
    a lid affixed to the package base so as to cover and seal the piezoelectric vibrating piece in the package.

7. A piezoelectric vibrating device, comprising:
    a piezoelectric vibrating piece as recited in claim 1;
    a package base to which the piezoelectric vibrating piece is mounted by connecting the supporting arms to the package base via at least one connecting portion per supporting arm; and
    a lid affixed to the package base so as to cover and seal the piezoelectric vibrating piece in the package.

* * * * *